(12) United States Patent
Yu et al.

(10) Patent No.: US 7,269,010 B2
(45) Date of Patent: Sep. 11, 2007

(54) HEAT DISSIPATION DEVICE

(75) Inventors: Fang-Xiang Yu, Shenzhen (CN);
Meng-Tzu Lee, Tu-Cheng (TW);
Shu-Ho Lin, Tu-Cheng (TW)

(73) Assignees: Fu Zhun Precision Industry (Shenzhen) Co., Ltd., Bao'an District, Shenzhen, Guangdong Province (CN);
Foxconn Technology Co., Ltd., Tu-Cheng, Taipei Hsien (TW)

( * ) Notice: Subject to any disclaimer, the term of this patent is extended or adjusted under 35 U.S.C. 154(b) by 81 days.

(21) Appl. No.: 11/204,687

(22) Filed: Aug. 15, 2005

(65) Prior Publication Data
US 2006/0120046 A1 Jun. 8, 2006

(30) Foreign Application Priority Data
Dec. 3, 2004 (CN) .................. 2004 2 0102396

(51) Int. Cl.
*H05K 7/20* (2006.01)
(52) U.S. Cl. .................. 361/697; 361/695; 257/707
(58) Field of Classification Search ............... 361/697, 361/601, 678, 679, 688, 717, 695; 257/675, 257/706, 707; 165/80.3; 24/458
See application file for complete search history.

(56) References Cited

U.S. PATENT DOCUMENTS

| | | | | |
|---|---|---|---|---|
| 5,594,623 | A * | 1/1997 | Schwegler | 361/697 |
| 6,188,131 | B1 * | 2/2001 | Nereng | 257/718 |
| 6,392,889 | B1 * | 5/2002 | Lee et al. | 361/704 |
| 6,449,151 | B1 * | 9/2002 | Chen | 361/697 |
| 6,450,248 | B1 * | 9/2002 | Chang | 165/80.3 |
| 6,538,888 | B1 * | 3/2003 | Wei et al. | 361/697 |
| 6,654,246 | B2 * | 11/2003 | Wu | 361/697 |
| 6,667,884 | B1 * | 12/2003 | Lee et al. | 361/697 |
| 6,816,373 | B2 | 11/2004 | Lee et al. | |
| 6,829,143 | B2 * | 12/2004 | Russell et al. | 361/704 |
| 6,854,181 | B2 * | 2/2005 | Sas et al. | 29/890.03 |
| 6,894,898 | B2 * | 5/2005 | Liu | 361/697 |
| 6,934,153 | B2 * | 8/2005 | Lee et al. | 361/697 |
| 6,950,306 | B2 * | 9/2005 | Huang et al. | 361/697 |
| 2002/0075654 | A1 * | 6/2002 | Chen | 361/709 |
| 2002/0179285 | A1 * | 12/2002 | Sas et al. | 165/80.3 |
| 2003/0063439 | A1 * | 4/2003 | Wei et al. | 361/703 |
| 2003/0079861 | A1 * | 5/2003 | Lee | 165/80.3 |
| 2003/0136545 | A1 * | 7/2003 | Lin et al. | 165/80.3 |
| 2004/0052055 | A1 * | 3/2004 | Liu | 361/719 |
| 2004/0066624 | A1 * | 4/2004 | Lee et al. | 361/697 |
| 2004/0085729 | A1 * | 5/2004 | Lin | 361/695 |
| 2004/0250993 | A1 * | 12/2004 | Ji-Hai et al. | 165/80.3 |

(Continued)

*Primary Examiner*—Anatoly Vortman
(74) *Attorney, Agent, or Firm*—Morris Manning & Martin LLP; Tim Tingkang Xia, Esq.

(57) ABSTRACT

A heat dissipation device for dissipating heat from an electronic package comprises a heat sink, a fan, a fan mounting structure, and fixing devices. The heat sink comprises a main body which comprises a cutout on each corner. The fan mounting structure mounts on two opposite sides of the heat sink and the fixing devices fix the fan on the fan mounting structure wherein the fixing devices extend through the mounting structure into the cutouts and do not damage the heat sink. The fan mounting structure has two lower plates fitted into two grooves in two opposite sides of the heat sink. Each lower plate extends along a whole length of each of the grooves.

19 Claims, 5 Drawing Sheets

U.S. PATENT DOCUMENTS

2005/0041394 A1* 2/2005 Liang et al. ................. 361/709
2005/0047089 A1* 3/2005 Hsu ........................... 361/697
2006/0034057 A1* 2/2006 Yang .......................... 361/704
2006/0039110 A1* 2/2006 Foster et al. ................. 361/697

* cited by examiner

HEAT DISSIPATION DEVICE

BACKGROUND

1. Field

The present invention relates generally to heat dissipation devices for removing heat from heat-generating devices such as electronic packages, and particularly to a heat dissipation device having improved structure for mounting an electric fan to a heat sink of the heat dissipating device.

2. Prior Art

As the electronics technology advances rapidly, electronic packages are able to process at a high speed. As a result, such electronic packages generate substantial amounts of heat. The heat must be removed from the electronic packages efficiently; otherwise, the electronic packages would malfunction. Thus, heat dissipation devices are attached to electronic packages to remove heat therefrom.

FIG. 4 shows a conventional heat dissipation device 5, which comprises a heat sink 51 including a plurality of space apart fins 511, a fan mounting structure 52 comprising a pair of fan fasteners 521. Each fan fastener 521 includes an upper plate 5211 where an electric fan 53 seats and a lower plate 5212 for attaching to one of two opposite lateral sides of the heat sink 51 by inserting the lower plate 5212 into a groove (not labeled) defined in a corresponding lateral side of the heat sink 51. The fan 53 is mounted to the fan mounting structure 52, particularly to the upper plates 5211. The heat dissipation device 5 further comprises a plurality of fixing devices 54 securing the fan 53 to the fan mounting structure 52. FIG. 5 demonstrates the assembled conventional heat dissipation device which shows that the fixing devices 54 extend through the fan 53 and the upper plates 5211 and engage with the fins 511.

However, the conventional heat dissipation device 5 has several drawbacks. The first drawback of the conventional heat dissipation device 5 is that during the process of fastening the fixing devices 54, the fixing devices 54 might deform the fins 511. The deformation of the fins 511 may damage the fins 511 and affect the heat dissipating effectiveness of the fins 511. Therefore, the heat dissipation efficiency of the heat dissipation device 5 is lowered. The fan mounting structure 52 relies on the lower plates 5212 inserted into the grooves to secure on the heat sink 51; however, the weak structure of the lower plates 5212 can be deformed during the assembly and unable to secure the fan mounting structure 52 to the heat sink 51. Once the lower plates 5212 are deformed, the fan 53 can not be seated on the fan mounting structure 52 securely and the fan 53 gains a space to vibrate when it is activated; thus noise is created when the fan 53 is activated. Moreover, the lower plate 5212 only engages in the corresponding groove with a part of a length of the groove; such a partial engagement between the lower plate 5212 and the groove can not ensure a sufficient connection between the lower plate 5212 and the heat sink 51, and thereby, the fan fastener 521 is possible to separate from the heat sink 51 by the vibration of the fan 53. Finally, each of the upper plate 5211 is consisted of a single layer which is a weak structure and has the drawback of unable to hold the fan stably for a long period. The fan 53 generally vibrates when it's activated. The vibration of the fan 53 would exert a large force on the upper plate 5211 which would deform the upper plate 5211 and hence gain a space between the upper plate 5211 and the fan 53. As the result, noise would be created when the fan 53 is activated and vibrates. Furthermore, the engagement of the fixing devices 54 with the single-layer upper plates 5211 may be loosen due to the vibration of the activated fan 53. Such a conventional heat dissipation device 5 is disclosed in U.S. Pat. No. 6,816,373.

Therefore, a novel design of a heat dissipation device is desired to overcome the aforementioned drawbacks, and increase the heat dissipation effect thereof.

SUMMARY

Accordingly, what is needed a heat dissipating which removes heat to atmosphere rapidly and has a satisfactory heat dissipation effect.

A heat dissipation device for dissipating heat from an electronic package in accordance with a preferred embodiment of the present invention comprises a heat sink, a fan mounting structure and a fan. The heat sink has a main body including fins, a pair of grooves defined on two opposite lateral sides of the main body, and a cutout defined on top of each corner of the main body. The fan mounting structure comprises a pair of fan fasteners each consisting of an upper plate, which contains fixing holes, and a lower plate inserted to a respective groove with a whole length of the respective groove. The fan is seated on the upper plates. A plurality of fixing devices, i.e. screws, fix the fan to the fan mounting structure, wherein the fixing devices extend through the fixing holes of the upper plates into the cutouts, respectively; thus, the fixing devices would not damage the fins. Furthermore, the fan mounting structure is firmly attached to the heat sink by the lower plates inserted into the grooves along the whole length of the grooves.

The upper plate comprises an upper portion and a lower portion bent from the upper portion toward a rear of the fan fastener, hence the strength of the upper plate is reinforced. The lower portion of the dual-layer structure of the upper plate creates a downward pull force on the fixing device, whereby the fixing devices can more securely connect the fan to the fan mounting structure. The fan is more securely fixed upon the mounting structure in accordance with the present invention; thus the mounting structure in accordance with the present invention leaves the fan with no room for vibrating when it is active and eliminates the noise made by the fan from vibration.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

DETAILED DESCRIPTION OF THE EMBODIMENT

Figure 1:
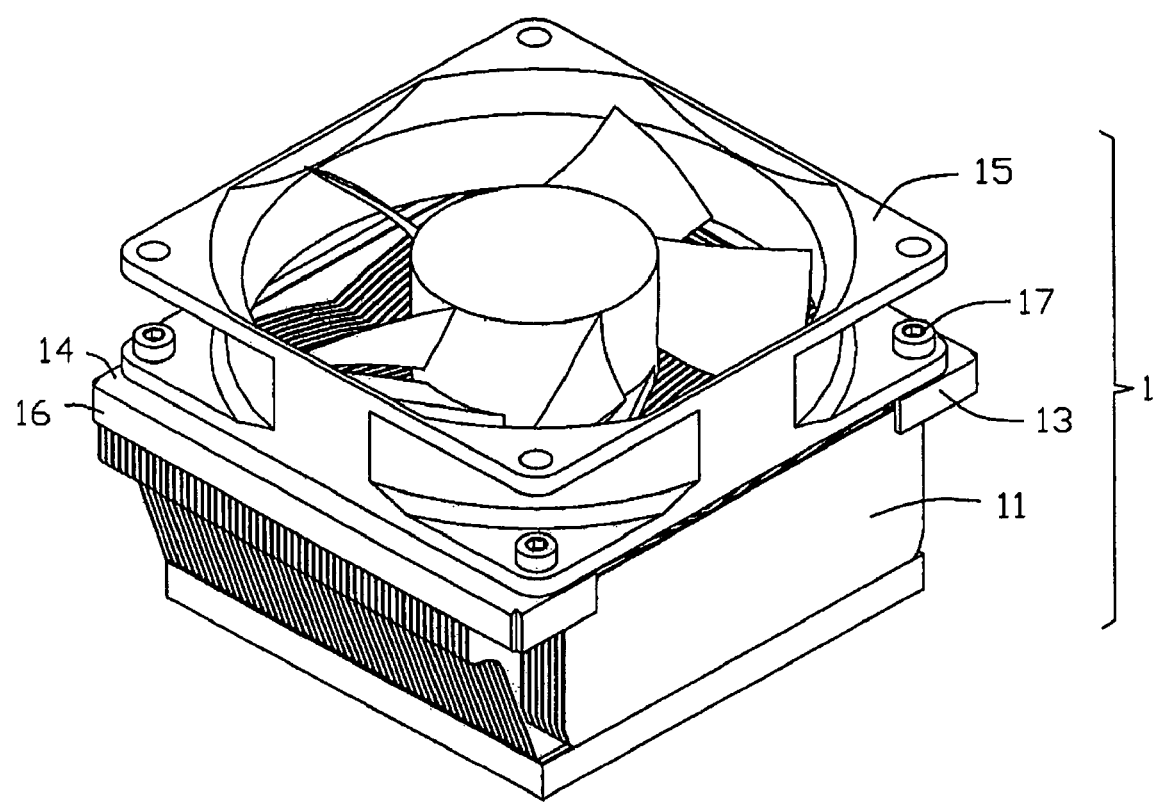
FIG. 1 is an assembled view of the a dissipation device in accordance with a preferred embodiment of the present invention.

Reference will now be made to the drawing figures to describe the present invention in detail.

Referring FIG. 1, a heat dissipation device 1 includes a heat sink 11 for being attached to a heat generating electronic package (not shown) for absorbing heat generated by the electronic package, a fan mounting structure 13 attached to the heat sink 11, an electric fan 15 mounted on the fan mounting structure 13 for generating airflows to remove the heat from the heat sink 11, and a plurality of fixing devices 17 to fix the fan 15 to the fan mounting structure 13. The fixing devices 17 are preferably screws.

Figure 2:
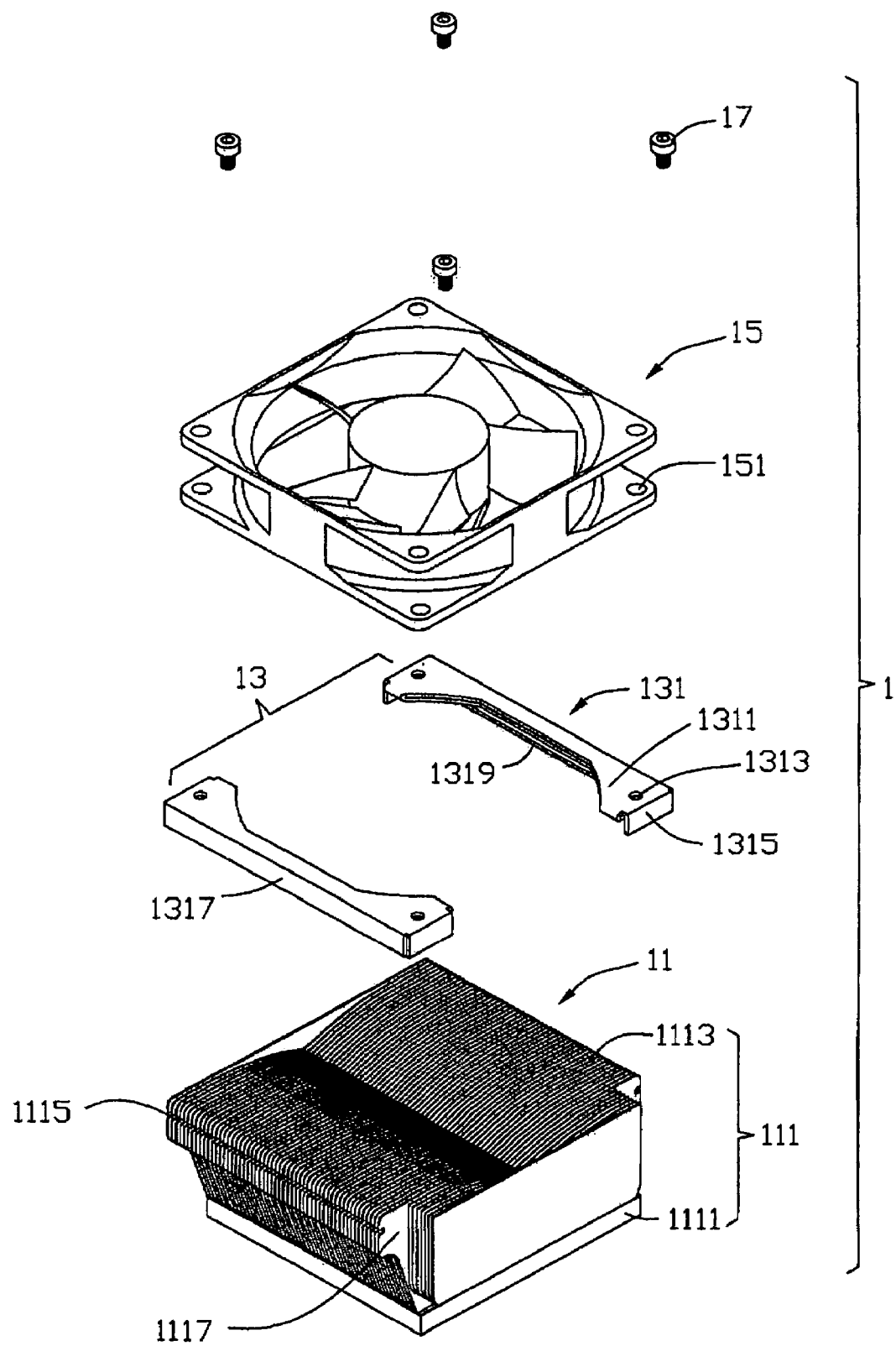
FIG. 2 is an exploded view of FIG. 1.

Referring to FIG. 2, the heat sink 11 includes a main body 111 which has a thermal conduct base 1111 for contacting with the heat generating electronic package and a plurality of space apart fins 1113. The base 1111 and fins 1113 are perpendicular to each other, and they are both generally made of metals. The main body 111 further has a pair of grooves 1115 on its two opposite lateral sides, and a cutout 1117 on top of each corner thereof. In this embodiment, the grooves 1115 are defined in the two opposite later sides of the fins 1113 of the main body 1111.

The fan mounting structure 13 includes a pair of fan fasteners 131 wherein each fan fastener 131 has an upper plate 1311 which has two fixing holes 1313 on top, and three plates extended downward from three sides of the upper plate 1311, respectively, thereby forming a pair of side plates 1315 on two opposite sides, and a back plate 1317 on the rear side. A lower plate 1319 extends frontward from a bottom of the back plate 1317, and is generally parallel to the upper plate 1311. Each fan fastener 131 is attached to the heat sink 11 by inserting the lower plate 1319 into the corresponding groove 1115 with the whole length of the corresponding groove 1115, and having the side plates 1315 positioned beside the corresponding cutouts 1117, respectively, and engaging with other two lateral sides of the main body 111, thereby to secure the fan fasteners 131 to an upper portion of the heat sink 11. The upper plates 1311 of the fan fasteners 131 covers a top of the main body 111 of the heat sink 11 above the grooves 1115, wherein each fixing hole 1313 is located just above the corresponding cutout 1117.

A fan 15 with a plurality of positioning holes 151 on each corner mounts on the fan mounting structure 13 by placing the fan 15 on the upper plates 1311 wherein the positioning holes 151 match the corresponding fixing holes 1313, and having the fixing devices 17, such as screws, fasten the fan 15 on the fan mounting structure 13. Each of the fixing devices 17, such as screws, extends through the corresponding positioning hole 151, the corresponding fixing hole 1313 and into the corresponding cutout 1117, and does not engage with the fins 1113; therefore, the fixing devices 17 would not damage the fins 1113 during the assembly.

Figure 3:
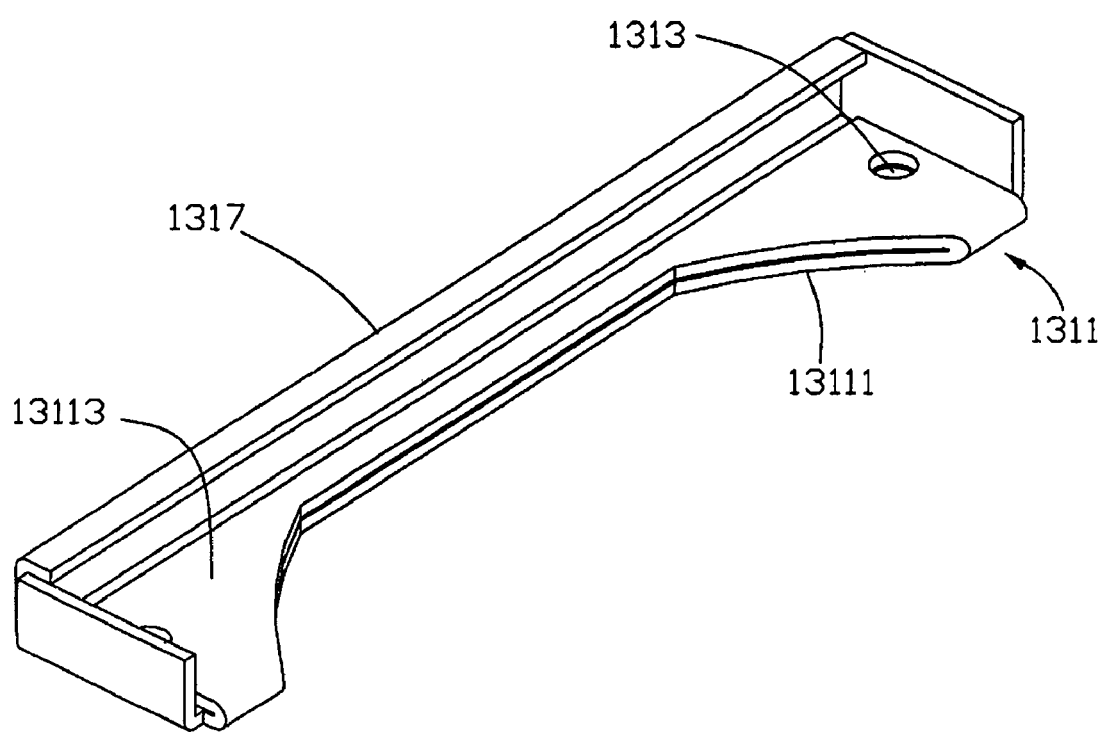
FIG. 3 is a bottom perspective of a fan fastener of the heat dissipation device demonstrated in FIG. 2.
Figure 4:
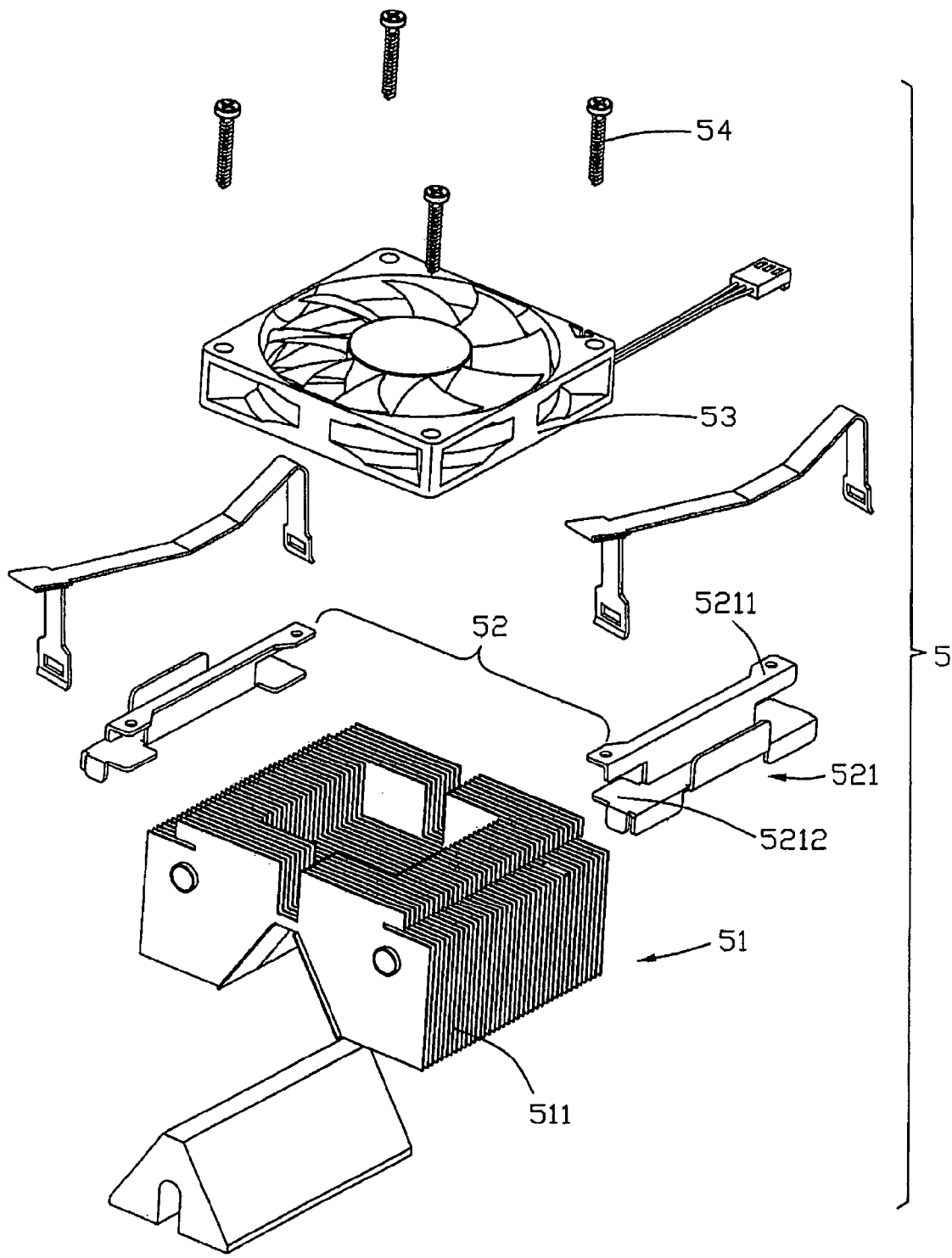
FIG. 4 is an exploded view of a conventional heat dissipation device.
Figure 5:
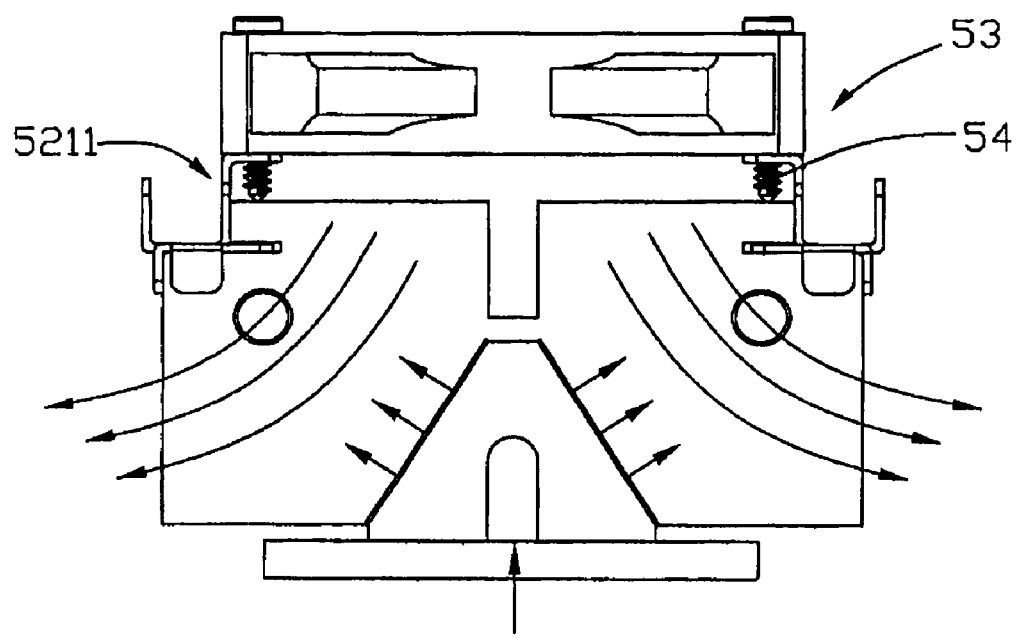
FIG. 5 is a schematic side elevation view of the conventional heat dissipation device demonstrated in FIG. 4 in an assembled state.

Referring to FIG. 3, the upper plate 1311 includes an upper portion 13111 and a lower portion 13113 bent from the upper portion 13111 toward the back plate 1317, and the fixing holes 1313 extend through upper portion 13111 and lower portion 13113; hence the upper plate 1311 is consisted of two layers so that the strength of the upper plate 1311 is reinforced.

Referring to FIGS. 1 and 3, as the fan 131 is fastened downward to the upper plates 1311 by the fixing devices 17, such as screws, the bent lower portion 13113 creates a downward pulling force on the fixing devices 17; thus, the fixing devices 17 can more securely fasten the fan 15 to the fan fasteners 131. By the secure fastening of the fan 15 to the fan fasteners 131, the fan 15 would then have no room to vibrate and create noise when it runs.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat dissipation device for dissipating heat from an electronic package, comprising:
    a heat sink comprising a main body, the main body comprising a thermal conduct base and a plurality of space apart fins being perpendicular to the thermal conduct base, and a cutout defined only on top of each corner of the main body;
    a fan mounting structure mounted to the fins of the heat sink and comprising a pair of fan fasteners, each fan fastener comprising an upper plate, a plurality of fixing holes in the upper plate, a pair of side plates extending downward from opposite sides of the upper plate, a back plate extending downward from a back side of the upper plate, and a lower plate extending perpendicularly inward from the back plate and paralleling to the upper plate;
    a fan; and
    a plurality of fixing devices attaching the fan to the fan mounting structure;
    wherein the fixing devices extend through the fixing holes of the upper plate into the cutouts.

2. The heat dissipation device as defined in claim 1, wherein the main body comprises a groove defined on each of two opposite sides of the main body.

3. The heat dissipation device as defined in claim 2, wherein the lower plate inserts to the groove to secure the fan fastener to the heat sink.

4. The heat dissipation device of claim 3, wherein the fins have a protruded top flange portion formed at each of the two opposite sides of the main body and protruding horizontally out of the base, the groove being defined in the protruded top flange portion, the cutout being defined by removing a part of the protruded top flange portion away from each corner of the main body.

5. The heat dissipation device as defined in claim 1, wherein the fixing devices are screws.

6. The heat dissipation device of claim 1, wherein the cutout is defined by removing a top portion of the fins in each corner of the main body.

7. The heat dissipation device as defined in claim 1, wherein the side plates engage edges of the main body to reinforce the connection between the fasteners and the heat sink.

8. The heat dissipation device as defined in claim 1, wherein the upper plate comprises an upper portion and a lower portion bent from the upper portion in a direction toward the back plate for reinforcing the structure strength of the upper plate.

9. The heat dissipation device as defined in claim 8, wherein the upper plate creates an upward force against the fan.

10. A heat dissipation device for electronic package comprising:
    a heat sink comprising a plurality of fins defining two grooves in two opposite sides of the heat sink;

a fan mounting structure comprising two fan fasteners mounted to the two opposite sides of the heat sink, respectively; and a fan mounted on the fan mounting structure; wherein each fan fastener has an upper plate on which the fan seats, a back plate extends downwards from a rear edge of the upper plate and a lower plate extends from the back plate into a corresponding groove, the lower plate extending along a whole length of the corresponding groove, and wherein the upper plate has an upper portion and a lower portion bent from the upper portion in a direction towards the back plate in order to reinforce the structure strength of the upper plate.

11. The heat dissipation device as defined in claim 10, wherein the heat sink has four cutouts in four corners thereof, respectively, and the fan is mounted to the fan mounting structure by extending screws through the fan into the upper plates of the fan fasteners and the cutouts.

12. The heat dissipation device of claim 11, wherein each of the four cutouts is defined by removing a top portion of the fins in each of the four corners of the heat sink.

13. The heat dissipation device as defined in claim 10, wherein the heat sink comprises a thermal conductive base and a plurality of fins secured to the fins, the grooves being defined in the fins.

14. The heat dissipation device as defined in claim 10, wherein the upper plate creates an upward force against the fan.

15. The heat dissipation device as defined in claim 10, wherein the each fan fastener further comprises two side plates located at two lateral sides of the upper plate, respectively, the side plate engaging the heat sink to reinforce the connection between the fasteners and the heat sink.

16. A heat dissipation device comprising:

a heat sink having a base for engaging with a heat-generating electronic package, and a plurality of fins extending upwardly, the fins cooperatively defining two opposites sides each defining a groove therein;

two fan fasteners each having a lower plate inserted into a corresponding groove along a whole length of the corresponding groove, and an upper plate having a dual-layer structure;

an electric fan mounted on the two fan fasteners; and a plurality of fixing devices extending downwardly through the electric fan and the upper plates of the fan fasteners into spaces defined by the fins, respectively.

17. The heat dissipation device of claim 16, wherein the fixing devices have no engagement with the fins.

18. The heat dissipation device of claim 17, wherein the spaces are defined in corners of the heat sink, respectively.

19. The heat dissipation device of claim 18, wherein each of the spaces is defined by removing a top portion of the fins in a corresponding corner of the heat sink.

\* \* \* \* \*